(12) United States Patent  
Bae

(10) Patent No.: US 7,368,226 B2
(45) Date of Patent: May 6, 2008

(54) METHOD FOR FORMING FINE PATTERNS OF SEMICONDUCTOR DEVICE

(75) Inventor: Sang Man Bae, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 510 days.

(21) Appl. No.: 10/998,814

(22) Filed: Nov. 30, 2004

(65) Prior Publication Data

US 2005/0175937 A1 Aug. 11, 2005

(30) Foreign Application Priority Data

Feb. 6, 2004 (KR) .................. 10-2004-0007844

(51) Int. Cl.
*G03F 7/00* (2006.01)

(52) U.S. Cl. ............... 430/311; 430/312; 430/314; 430/394

(58) Field of Classification Search .......... 430/394, 430/311, 313, 330, 314, 317, 318, 312
See application file for complete search history.

(56) References Cited

U.S. PATENT DOCUMENTS 5,096,802 A * 3/1992 Hu .......................... 430/328
5,259,924 A * 11/1993 Mathews et al. ........... 438/702
5,900,163 A * 5/1999 Yi et al. ..................... 216/79
6,080,680 A * 6/2000 Lee et al. ................... 438/727
2003/0003401 A1* 1/2003 Wiltshire .................... 430/311

FOREIGN PATENT DOCUMENTS

| JP | 61-256633 A | 11/1986 |
| JP | 10-313114 | * 11/1998 |
| KR | 1019940024522 A | 11/1994 |
| KR | 1020000043508 A | 7/2000 |

\* cited by examiner

*Primary Examiner*—Mark F. Huff
*Assistant Examiner*—Caleen O. Sullivan
(74) *Attorney, Agent, or Firm*—Townsend and Townsend and Crew, LLP

(57) ABSTRACT

A method for forming fine patterns of a semiconductor device is provided, the method including forming a first lower layer pattern having a width of two minimum line width and a space pattern on a semiconductor substrate prior to a C-HALO implant process and etching the first lower layer pattern to separate into a second lower layer pattern having a width of two minimum line widths and a space pattern.

14 Claims, 6 Drawing Sheets

METHOD FOR FORMING FINE PATTERNS OF SEMICONDUCTOR DEVICE

BACKGROUND OF THE INVENTION

1. Field of the Invention

The present invention generally relates to a method for forming fine patterns of a semiconductor device and more specifically, to a method for forming fine patterns of a semiconductor device, wherein a first lower layer pattern having a width of two minimum line width and a space pattern is formed on a semiconductor substrate prior to a C-HALO implant process and the first lower layer pattern is etched to separate into a second lower layer pattern having a width of two minimum line widths and a space pattern.

2. Description of the Related Art

Generally, fabricating semiconductor devices such as Dynamic Random Access Memory ("DRAM"), Static Random Access Memory ("SRAM"), and LOGIC requires to employ a lithography process using a short wavelength light source for obtaining fine patterns.

The lithography process includes depositing a photoresist film over a semiconductor substrate, exposing the photoresist film using a laser light source the wavelength of which is 365 nm, 248 nm, 193 nm, or 153 nm through an exposure mask having circuit patterns and then developing the exposed photoresist film.

However, the above-described lithography process is required to be performed in an exposure apparatus using a short wavelength light source and a photoresist material highly sensitive to short wavelength light must be used. As a result, formation of fine patterns having a line width less than 0.1 μm is not facile.

Moreover, when a C-HALO implant process is performed to implant an impurity into a space between every other gate patterns having a less than 0.1 μm line width in a semiconductor device such as 90 nm DRAM to improve its electrical characteristics such as threshold voltage Vt, the implant process cannot be performed perfectly since the gate patterns have a narrow space therebetween and a large step difference.

FIGS. 1a through 1d are cross-sectional views illustrating a conventional method for forming fine patterns of semiconductor device.

Referring to FIG. 1a, a lower layer 3 to be etched is deposited on a semiconductor substrate 1. A first photoresist film (not shown) is deposited on the lower layer 3, and then subjected to an exposure and development process using an exposure mask (not shown) having fine patterns to form a first photoresist film pattern.

Referring to FIG. 1b, the lower layer 3 is etched via an etching process using the first photoresist pattern 5 as an etching mask to form a first lower layer pattern 3-1.

The width of the first lower layer pattern denoted as 'a' ranges from 10 nm to 150 nm, and a width of a space between the patterns ranges from 10 nm to 150 nm.

Referring to FIG. 1c, a second photoresist film 7 is formed on the semiconductor substrate 1 including the first lower layer pattern 3-1.

Referring to FIG. 1d, a second photoresist pattern 7-1 for a subsequent C-HALO implant process is formed via an exposure and development process. The second photoresist pattern 7-1 exposes spaces between every other lower layer pattern 3-1.

The semiconductor substrate 1 is then subjected to a C-HALO implant process 9 using Br ions to form an ion-implanted region 13.

When microscopic patterns below 0.1 μm, for example 0.05 μm using the short wavelength light source having a wavelength of 248 nm or 193 nm, the second photoresist layer pattern 7 is not completely removed during the development process, thereby causing a step difference due to the remaining photoresist pattern 11 at the bottom of the space as shown in FIG. 1e.

This phenomenon cannot be prevented in a subsequent development process such as a wet etching process even when a high-resolution photoresist material is used because the space between the patterns is narrow and deep.

Particularly, as an exposure apparatus having a high numerical aperture ("NA") is widely used, depth-of-focus ("DOF") is decreased and completely removing the photoresist material between the lower layer patterns having a large step difference is almost impossible.

Accordingly, when the photoresist film remains between the patterns, a shadow phenomenon renders the subsequent C-HALO implant process unstable. A collapse of the fine patterns on the lower layer pattern occurs, generating process defects, and decreasing the yield rate of the semiconductor device.

SUMMARY OF THE INVENTION

Accordingly, it is an object of the present invention to provide method for forming fine patterns in semiconductor device, wherein a residue of the photoresist film between the patterns is completely removed during formation of fine patterns of the semiconductor device so that a subsequent C-HALO implant process is performed without any defects.

In order to achieve above-described object, there is provided a method for forming a contact of a semiconductor device comprising the steps:

(a) forming an lower layer to be etched over a semiconductor substrate;

(b) depositing a first photoresist film on the lower layer;

(c) forming a first photoresist film pattern having a width of two line patterns and a space pattern, and exposing a bit line contact region;

(d) etching the lower layer using the first photoresist film pattern as an etching mask until the semiconductor substrate is exposed to form a first lower layer pattern;

(e) subjecting the semiconductor substrate to a C-HALO implant process to form an ion-implanted region on a portion of the semiconductor substrate between the first lower layer line patterns;

(f) removing the remaining first photoresist film on the first lower layer pattern;

(g) depositing a second photoresist film on the semiconductor substrate including the first lower layer pattern;

(h) forming a second photoresist film pattern having a width of two line patterns and a space pattern, and exposing a storage node contact region; and (i) etching the first lower layer pattern using the second photoresist film pattern as an etching mask until the semiconductor substrate is exposed to form a second lower layer pattern.

DETAILED DESCRIPTION OF THE EXAMPLARY EMBODIMENTS

A method for forming fine patterns of a semiconductor device in accordance with an embodiment of the present invention will now be described in detail with reference to the accompanying drawings. Wherever possible, the same reference numbers will be used throughout the drawings to refer to the same or like parts.

FIG. 2a through FIG. 2e illustrate a method for forming fine patterns of a semiconductor device according to the present invention.

Figure 1A:
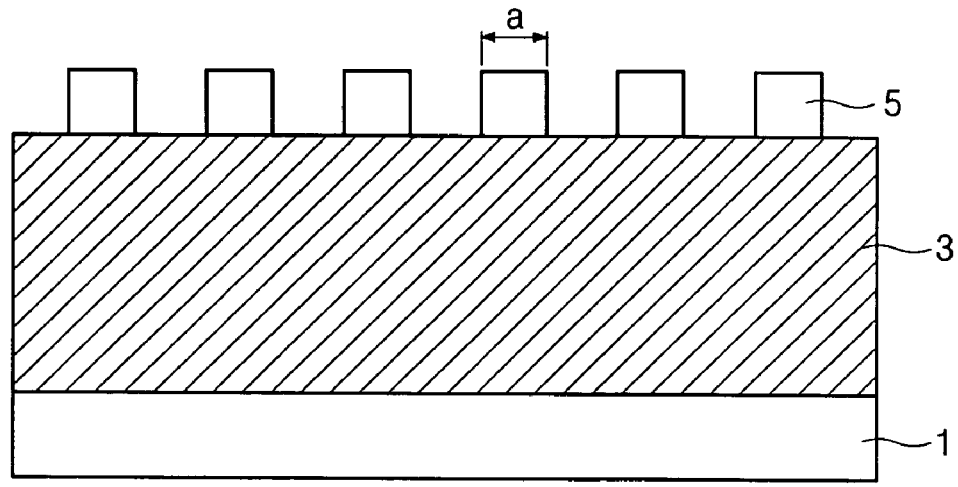
FIG. 1a through FIG. 1d are cross-sectional views illustrating a conventional method for forming fine patterns of semiconductor device.
Figure 1B:
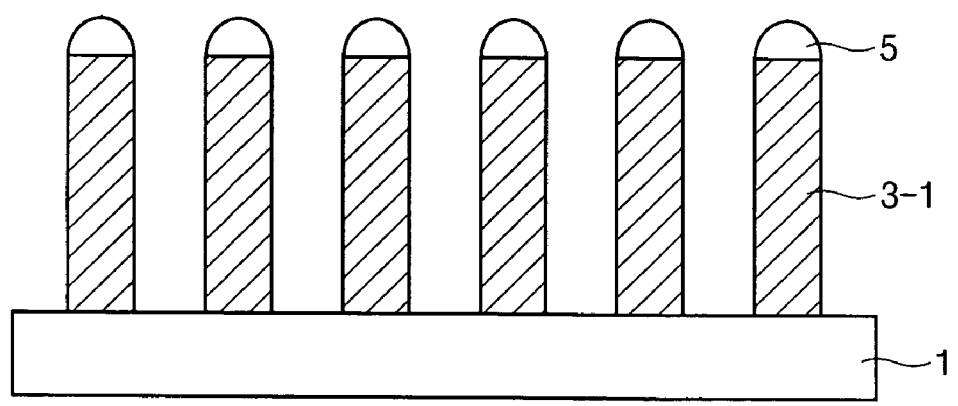
Figure 1C:
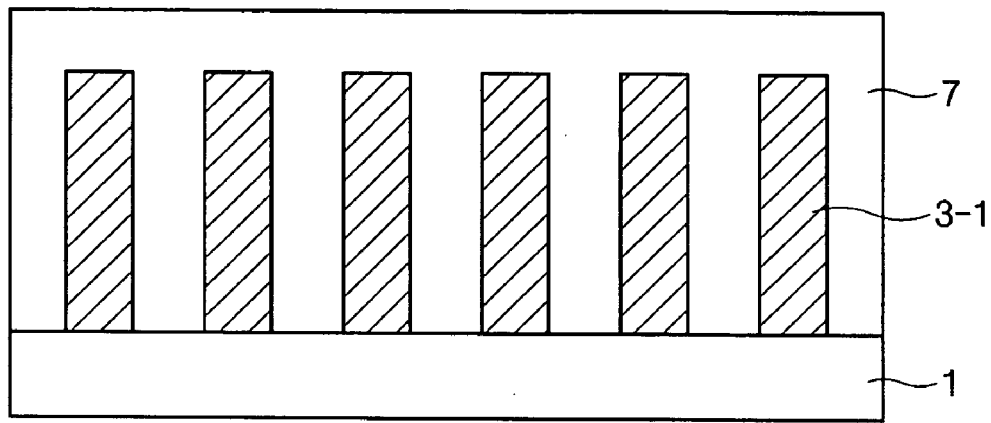
Figure 1D:
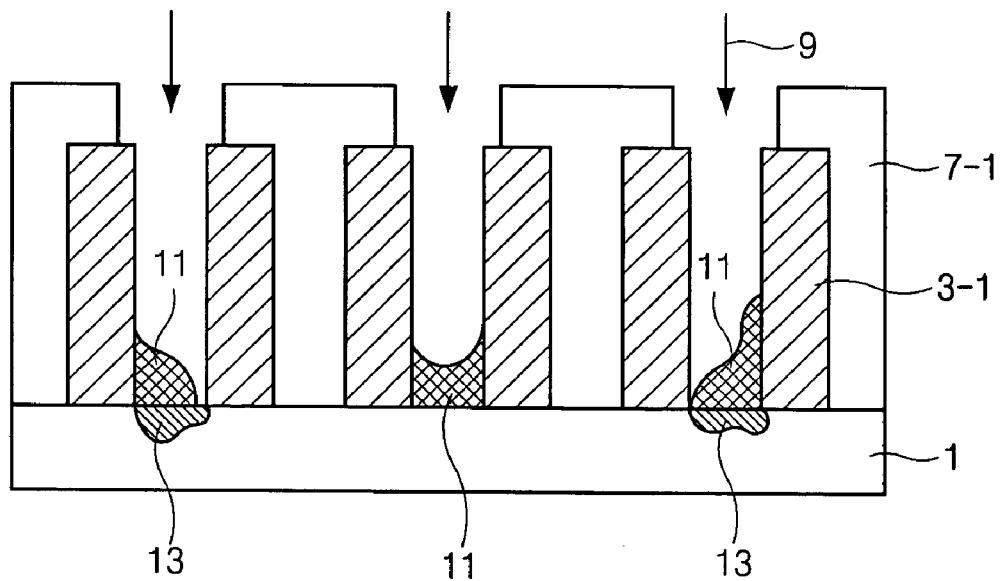
Figure 1E:
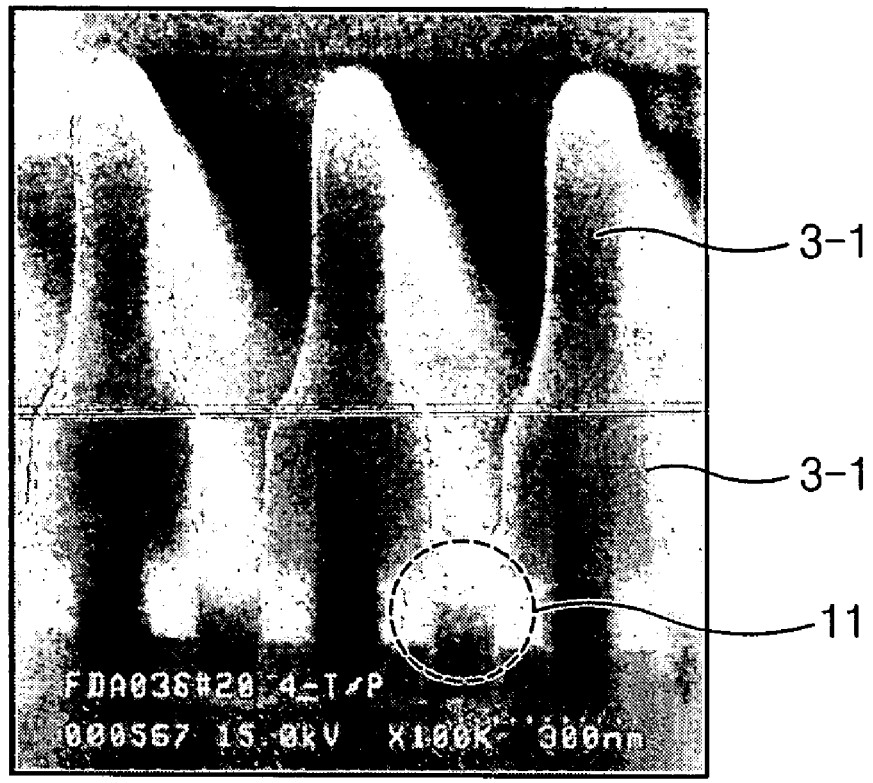
FIG. 1e is a photo illustrating a photoresist pattern for a C-HALO implant process according to the conventional method.
Figure 2A:
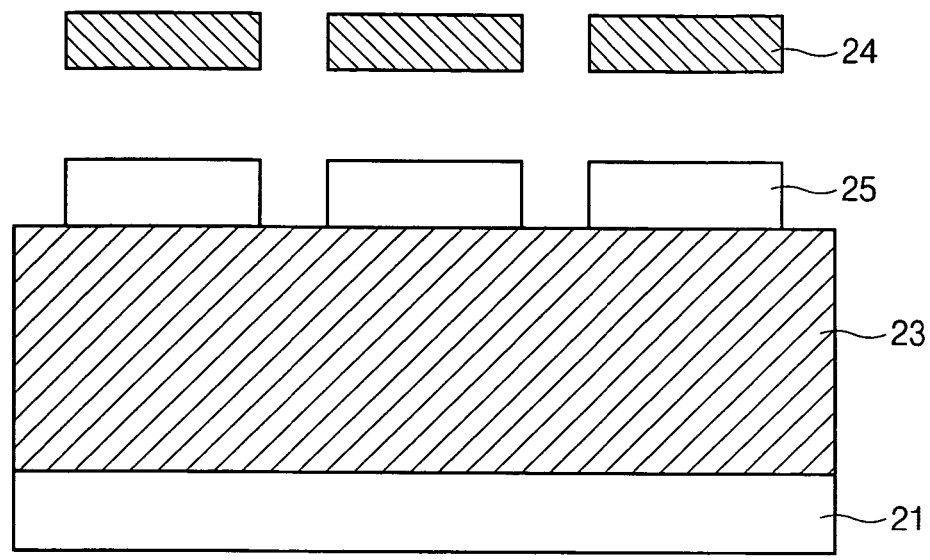
FIG. 2a through FIG. 2f are cross-sectional views illustrating a method for forming fine patterns of semiconductor device according to the present invention.

Referring to FIG. 2a, a lower layer 23 to be etched is formed on a semiconductor substrate 21, and a first photoresist film (not shown) is then deposited on the lower layer 23.

The first photoresist film pattern 25 exposing bit line contact region is formed using a first exposure mask 24. The first photoresist film pattern 25 has a width, which is denoted as 'b' of two line patterns and a space pattern.

Figure 2B:
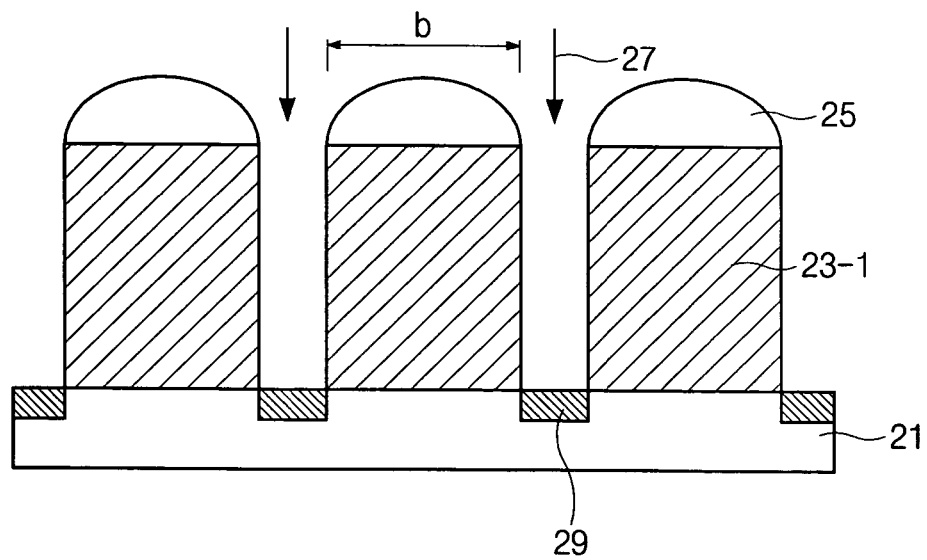

Referring to FIG. 2b, the lower layer 23 is etched using the first photoresist pattern 25 as an etching mask until the semiconductor substrate is exposed to form a first lower layer pattern 23-1.

When the lower layer comprises a nitride film, the etching process is performed using a gas selected from the group consisting of $CHF_3$, $O_2$, Ar and combinations thereof. When the lower layer comprises a metal film such as a tungsten film, the etching process is performed using a gas selected from the group consisting of SF6, Ar and combinations thereof. When the lower layer comprises a polysilicon film, the etching process is performed using a selected from the group consisting of $Cl_2$, HBr, $O_2$ and combinations thereof.

The width 'b' of the first lower layer line pattern 23-1 ranges from 30 nm to 450 nm, more preferably from 90 nm to 300 nm. In addition, the width of the space between the first lower layer patterns 23-1 ranges from 30 nm to 300 nm, more preferably from 60 nm to 150 nm.

Thereafter, a cleaning process and an oxide thin film deposition process may be further carried out. The cleaning process is performed using a solution of $H_2SO_4$ and $H_2O_2$ so as to remove a residue of a polymer or photoresist film within the space between the first lower layer patterns 23-1. The oxide thin layer deposition process is performed to form a thermal oxidation film or a sealing nitride film having a thickness ranging from 10 Å 300 Å.

Subsequently, the semiconductor substrate exposed through the space between the first lower layer patterns 23-1 is subjected to a C-HALO implant process 27 to form an ion-implanted region 29.

The C-HALO implant process 27 is performed via a medium implant method using Br and $BF_2$ ions at an energy of 50 Kev and a dose of $2\times10^{13}$ ions/$cm^2$.

Figure 2C:
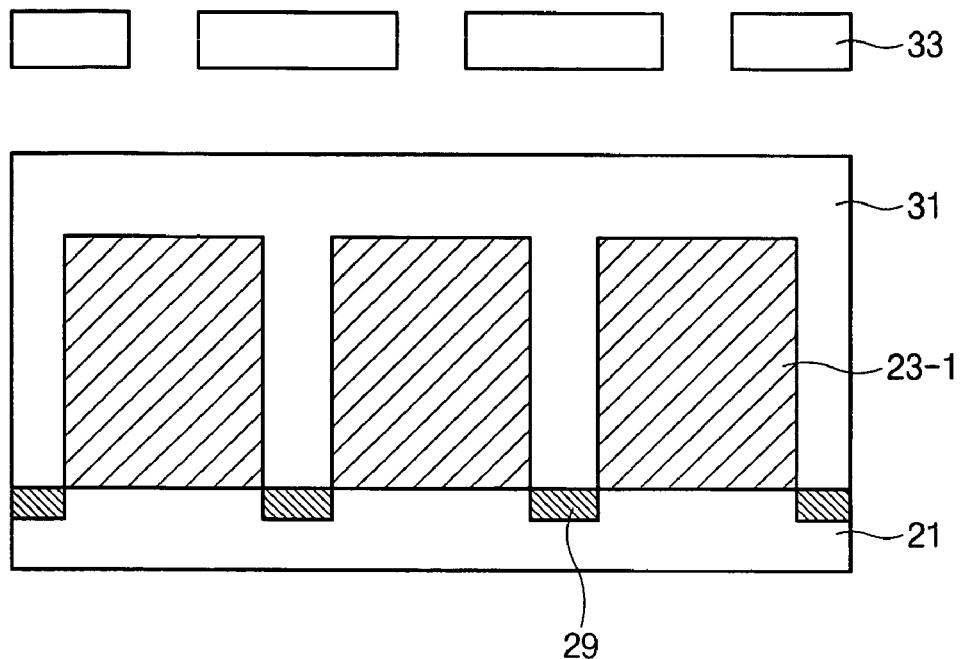

Referring to FIG. 2c, the remaining first photoresist film 25 on the first lower layer patterns 23-1 is removed, and a second photoresist layer 31 is then deposited on the semiconductor substrate including the first lower layer patterns 23-1.

Figure 2D:
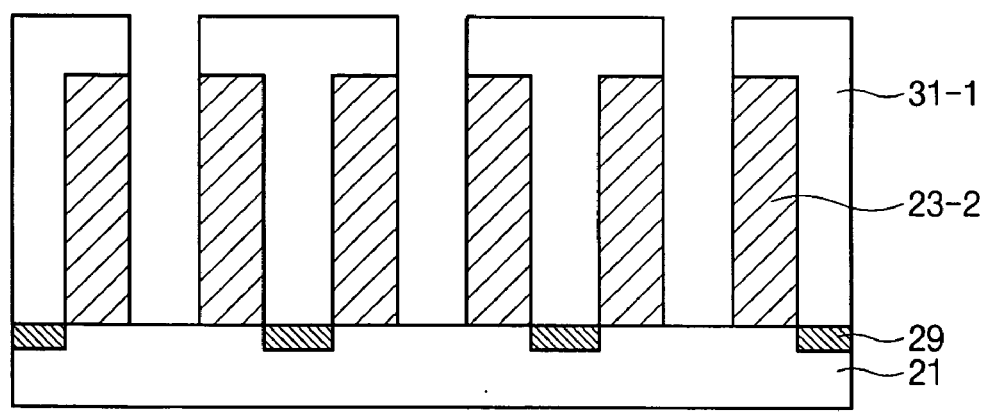

Referring to FIG. 2d, a second photoresist film pattern 31-1 is formed using a second photo mask 33, wherein the second photoresist film pattern 31-1 has a width of two line patterns and a space pattern.

The first lower layer pattern 23-1 is etched using the second photoresist film pattern 31-1 as an etching mask until the semiconductor substrate is exposed to form a second lower layer pattern 23-2.

The C-HALO implant process may be preformed using a subsequent second lower layer pattern 23-2 as an implant mask instead of the first lower layer pattern 23-1. In addition, a cleaning process may be further performed prior to or after the C-HALO implant process.

Thereafter, the exposed storage node contact region may further be subjected to a blanket implant process using Br or In as an ion source so as to improve or control the electrical characteristic of the semiconductor device.

The C-HALO implant process may be performed using the second lower layer pattern 23-2 instead of the first lower layer pattern as an implant mask. In this case, after formation of the second photoresist pattern 31-1, a descum process for removing about 100 Å of the second photoresist pattern 31-1 is further performed using $O_2$ gas to make the space between patterns more stable (referring to FIG. 2f).

Figure 2E:
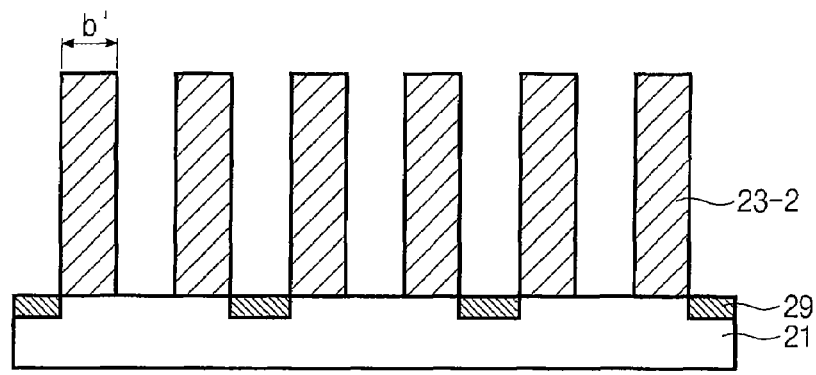
Figure 2F:
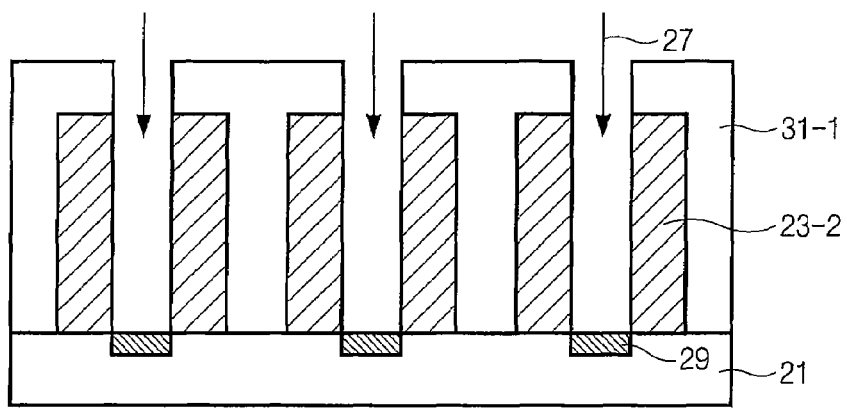

Referring to FIG. 2e the second photoresist pattern 31-1 on the second lower layer pattern 23-2 of FIG. 2d is removed. The width of the second lower layer pattern ranges from 10 nm to 150 nm, preferably from 30 nm to 150 nm. The space between the second lower layer patterns ranges from 10 nm to 150 nm.

After formation of fine patterns according to an embodiment of the present invention is completed, it is preferably that a pattern splitting process is performed so as to confirm that the resulting pattern of the present invention is the same as that of the conventional method.

In addition, the first and second photoresist film may be expanded or reflowed at a temperature ranging from 120° C. to 300° C., so that patterns having a width ranging from 30 nm to 80 nm can be formed using a light source having a wavelength of 248 nm.

The first and second photoresist films may be a positive or a negative type.

As described above, in accordance with the method for forming fine patterns of the present invention, a first lower layer pattern having a width of two minimum line width and a space pattern is formed on a semiconductor substrate prior to a C-HALO implant process, and the first lower layer pattern is etched to separate into a second lower layer pattern having a width of two minimum line width and a space pattern, whereby collapse risk of the fine patterns is reduced and dipole is used as an aperture in an illumination technology. As a result, further fine patterns may be formed.

Since the width of the photoresist film pattern is three times larger than that of a conventional one, the volume of the photoresist pattern is increased, which Moreover, since the first photoresist pattern in formation of the first lower layer pattern is used as an implant mask without forming a separate implant mask for the C-HALO implant process, processing time and costs are reduced, thereby decreasing a turn around time ("TAT"). The remaining photoresist pattern within the space between the lower layer patterns can be completely removed via the dry etching process, thereby inhibiting the shadow phenomenon in the C-HALO implant process. As a result, the process yield of the device is increased.

In addition, a second implant process may be further carried out after the C-HALO implant process. As a result, a cell voltage difference can be further improved.

As the present invention may be embodied in several forms without departing from the spirit or scope thereof, it should also be understood that the above-described embodiments are not limited by any of the details of the foregoing description. Rather the present invention should be construed broadly as defined in the appended claims. All changes and modifications that fall within the metes and bounds of the claims, or equivalences of such metes and bounds are intended to be embraced by the appended claims.

What is claimed is:

1. A method for forming fine patterns of a semiconductor device, comprising the steps of:

forming an lower layer to be etched over a semiconductor substrate;

forming a first photoresist file pattern having a width of two line patterns and one space pattern on the lower layer;

etching the lower layer using the first photoresist film pattern as an etching mask until the semiconductor substrate is exposed to form a first lower layer pattern;

subjecting the exposed semiconductor substrate to a C-HALO implant process to form an ion-implanted region;

removing the first photoresist film pattern on the first lower layer pattern;

patterning a second photoresist film pattern, the second photoresist pattern having a substantially same size as the first photoresist film pattern and shifted from the first photoresist pattern by a distance corresponding to one line pattern and one space pattern; and etching the first lower layer pattern using the second photoresist film pattern as an etching mask until the semiconductor substrate is exposed to form a second lower layer pattern.

2. The method according to claim 1, further comprising performing a cleaning process prior to or after the C-HALO implant process.

3. The method according to claim 1, wherein the width of the first lower layer pattern ranges from 30 nm to 450 nm, and the width of the space between the first lower layer patterns ranges from 30 nm to 300 nm.

4. The method according to claim 1, wherein the width of the first lower layer pattern ranges from 90 nm to 300 nm, and the width of the space between the first lower layer patterns ranges from 60 nm to 150 nm.

5. The method according to claim 1, wherein the width of the second lower layer pattern ranges from 10 nm to 150 nm, and the width of the space between the second lower layer patterns ranges from 10 nm to 150 nm.

6. The method according to claim 1, wherein the lower layer comprising a nitride film and the processes of etching the lower layer and the first lower layer pattern are performed using a gas selected from the group consisting of $CHF_3$, $O_2$, Ar, and combinations thereof.

7. The method according to claim 1, wherein the lower layer comprises a metal film and the processes of etching the lower layer and the first lower layer pattern are performed using a gas selected from the group consisting of $SF_6$, Ar, and combinations thereof.

8. The method according to claim 1, wherein the lower layer comprises a polysilicon film and the processes of etching the lower layer and the first lower layer pattern are performed using a gas selected from the group consisting of $CL_2$, HBr, $O_2$, and combinations thereof.

9. The method according to claim 1, wherein the C-HALO implant process is performed using an ion selected from the group consisting of Br and $BF_2$.

10. The method according to claim 1, further comprising subjecting the semiconductor substrate to a blanket implant process using a selected from the group consisting of Br and In after formation of the second lower layer pattern.

11. The method according to claim 1, further comprising expanding or reflowing the first or second photoresist film pattern at a temperature ranging from 120° C. to 300° C.

12. The method according to claim 1, wherein the first and second photoresist films are a positive or negative type respectively.

13. A method for forming fine patterns of a semiconductor device, comprising the steps of:

forming an lower layer over a semiconductor substrate;

forming a first photoresist film pattern having a width of two line patterns and a space pattern on the lower layer;

etching the lower layer using the first photoresist film pattern as an etching mask to form a first lower layer pattern;

removing the first photoresist film pattern on the first lower layer pattern;

forming a second photoresist film pattern having a width of two line patterns and one space pattern on the semiconductor substrate including the first lower layer pattern;

etching the first lower layer pattern using the second photoresist film pattern as an etching mask until the semiconductor substrate is exposed to form a second lower layer pattern, wherein the width of the second lower layer pattern is less than the width of the first layer pattern; and subjecting the exposed semiconductor substrate to a C-HALO implant process to form an ion-implanted region.

14. The method according to claim 1, wherein the ratio of a line width of the line pattern to a line width of the space pattern defined between two neighboring line patterns is substantially 1:1.

* * * * *